United States Patent
Soh et al.

(10) Patent No.: US 8,436,334 B2
(45) Date of Patent: May 7, 2013

(54) FABRICATION OF PHOSPHOR FREE RED AND WHITE NITRIDE-BASED LEDS

(75) Inventors: Chew Beng Soh, Singapore (SG); Soo Jin Chua, Singapore (SG); Wei Liu, Singapore (SG); Jing Hua Teng, Singapore (SG)

(73) Assignee: Agency for Science, Technology and Research, Singapore (SG)

( * ) Notice: Subject to any disclaimer, the term of this patent is extended or adjusted under 35 U.S.C. 154(b) by 233 days.

(21) Appl. No.: 12/682,526

(22) PCT Filed: Oct. 12, 2007

(86) PCT No.: PCT/SG2007/000350
§ 371 (c)(1),
(2), (4) Date: May 25, 2010

(87) PCT Pub. No.: WO2009/048425
PCT Pub. Date: Apr. 16, 2009

(65) Prior Publication Data
US 2010/0224857 A1    Sep. 9, 2010

(51) Int. Cl.
*H01L 21/00* (2006.01)
(52) U.S. Cl.
USPC .......... 257/13; 257/14; 257/15; 257/E33.008; 438/20
(58) Field of Classification Search .............. 257/13–15, 257/E33.008; 438/20
See application file for complete search history.

(56) References Cited

U.S. PATENT DOCUMENTS

| | | | |
|---|---|---|---|
| 6,445,009 B1 | 9/2002 | Grandjean et al. | |
| 6,482,664 B1 | 11/2002 | Lee et al. | |
| 6,604,824 B2 * | 8/2003 | Larson | 351/159 |
| 6,967,346 B2 | 11/2005 | Chien et al. | |
| 2003/0059971 A1 | 3/2003 | Chua et al. | |
| 2004/0023427 A1 | 2/2004 | Chua et al. | |
| 2005/0082974 A1 | 4/2005 | Fukasawa et al. | |
| 2005/0191778 A1 | 9/2005 | Ohtsuka et al. | |
| 2006/0145137 A1 | 7/2006 | Wang et al. | |

(Continued)

FOREIGN PATENT DOCUMENTS

| | | |
|---|---|---|
| JP | 10-079501 A | 3/1998 |
| JP | 2003013858 A1 | 10/2003 |
| WO | WO2008/030183 A1 | 3/2008 |

OTHER PUBLICATIONS

S. Nakamura: The Blue Laser Diode: GaN Based Light (Springer, Berlin 1997), 230. First generation White LEDs: Use of (YAG:Ce) Phosphor combined with blue InGaN based LEDs.

(Continued)

*Primary Examiner* — Jami M Valentine
(74) *Attorney, Agent, or Firm* — Kilpatrick Townsend & Stockton LLP

(57) ABSTRACT

A multiple quantum well (MQW) structure for a light emitting diode and a method for fabricating a MQW structure for a light emitting diode are provided. The MQW structure comprises a plurality of quantum well structures, each quantum well structure comprising: a barrier layer; and a well layer having quantum dot nanostructures embedded therein formed on the barrier layer, the barrier and the well layer comprising a first metal-nitride based material; wherein at least one of the quantum well structures further comprises a capping layer formed on the well layer, the capping layer comprising a second metal-nitride based material having a different metal element compared to the first metal-nitride based material.

9 Claims, 19 Drawing Sheets

U.S. PATENT DOCUMENTS

| | | | |
|---|---|---|---|
| 2006/0255347 A1 | 11/2006 | DenBaars et al. | |
| 2007/0201522 A1 | 8/2007 | Huffaker et al. | |
| 2009/0209746 A1* | 8/2009 | Bagger et al. | 536/18.5 |
| 2009/0302308 A1* | 12/2009 | Chua et al. | 257/13 |

OTHER PUBLICATIONS

Y. Kim et al., J. Electrochem. Soc. 150, H57(2003). Use of ZnS based phosphor e.g ZnS:Coupling, Al or $SrGa_2S_4$:$Eu^{2+}$.

N. Hirosaki et al., APL, 86, 211905 (2005). Use of β-SiAlON:$Eu^{2+}$ green phosphor; and.

J.K. Park et al., APL, 84 1647 (2004). Uwe of $Eu^{2+}$ activated $Sr_3SiO_5$ yellow phosphor.

International Search Report enclosing cited documents US2004/0023427-A1, US2003/0059971-A1 and JP10-079501.

PCT/SG2007/000350, International Preliminary Report on Patentability, Apr. 13, 2010.

First Office Action with English translation, issued from State of Intellectual Property Office (SIPO) for Patent Application No. 200780101059.8, Mar. 24, 2011.

First Office Action English translation, issued from Japanese Patent Office for Patent Application No. 2010-528843.

* cited by examiner

FABRICATION OF PHOSPHOR FREE RED AND WHITE NITRIDE-BASED LEDS

FIELD OF INVENTION

The present invention relates broadly to a multiple quantum well structure for a light emitting diode and to a method for fabricating a multiple quantum well structure for a light emitting diode.

BACKGROUND

Light emitting diodes (LEDs) can serve as a source of lighting and are typically used in applications such as outdoor full colour displays, traffic lights, data storage, solid state lighting and communications. Typically, a III-nitride based LED emits light with a wavelength corresponding to the bandgap of active Indium Gallium Nitride/Gallium Nitride (InGaN/GaN) multiple quantum well (MQW) layers. Light is generated when a bias is applied across a p-n junction of the GaN layers. In the LED, holes and electrons injected by the p-type and n-GaN layers combine at the active layers to emit light from the LED surface.

Epitaxial growth of InGaN/GaN MQWs is practically challenging e.g. when high In content is incorporated for long wavelength applications such as for green or yellow LEDs. Furthermore, light output efficiency is typically lowered for light emission with increasing wavelengths with higher In incorporation. Lowering of the growth temperature can result in an increase in incorporation of In but the lower temperature typically causes a reduction in the photoluminescence (PL) intensity as the crystalline quality is degraded.

InGaN quantum dots have been explored for enhancing quantum efficiency in LEDs [see e.g. CHOI et al., WO-2004/054006 A1]. Emission colour from LEDs can been tuned from blue to orange by controlling the dimension of quantum dots [see e.g. Grandjean et al. U.S. Pat. No. 6,445,009 B1]. DenBaars et. al in US2006/0255347 A1 describe doping GaN with one or more rare earth transitional elements to obtain a tunable LED with a variety of color shades. These transitional elements include Cr, Ti and Co and it is proposed that white light can be generated using a combination of these elements. However, it is practically difficult to control the depth of implantation into a thin active layer of an MQW structure.

Chua et al. in US2004/0023427 A1 describe white light emission using InGaN quantum dots incorporated in a well layer in MQW structures for LEDs. However, out-diffusion of the quantum dots into the well, or into a barrier layer when high temperature in-situ annealing is carried out for activation of a p-dopant Magnesium (Mg) was experienced. This typically causes the MQWs layer to be less well-defined. Thus, the confinement effect due to the quantum dots can be compromised. Furthermore, in US2004/0023427 A1, the colours of emission from the LED cannot be precisely controlled causing the degree of whiteness of the LED to vary.

Currently, visible red-orange and yellow light sources are typically achieved based on Aluminum Indium Gallium Phosphate (AlInGaP) material, while bright green, blue and violet LEDs are typically fabricated from GaN based material systems. However, in current technologies, GaN based LEDs are not known to have red emission, which is typically needed to provide a red component to generate white light emission.

Typically, to produce white light from LEDs, a combination of separate LEDs each emitting individual colours of red, green and blue light is used. Alternatively, individual blue and yellow LEDs are combined to produce white light. One disadvantage is that multiple LEDs of different materials are used to generate the white light and this increases complexity of the fabrication technique and the overall fabrication cost. The resulting device typically uses complicated control electronics since different diode types use different applied voltages. Furthermore, different degradation rates of the materials used, e.g., AlInGaP (for red emission) and InGaN (for green and blue emission), typically affect reliability or quality of the white light obtained. The above reliability/quality problem also arises for an alternative fabrication method using yellow phosphor coated blue LEDs for white light generation because of degradation of phosphor. In addition, the use of phosphor typically increases the production cost and lowers external quantum efficiency due to absorption in the phosphor.

Hence, there exists a need for a multiple quantum well structure (MQW) for a light emitting diode and a method for fabricating a MQW structure for a light emitting diode to address at least one of the above problems.

SUMMARY

In accordance with a first aspect of the present invention, there is provided a multiple quantum well (MQW) structure for a light emitting diode, the MQW structure comprising, a plurality of quantum well structures, each quantum well structure comprising: a barrier layer; and a well layer having quantum dot nanostructures embedded therein formed on the barrier layer, the barrier and the well layer comprising a first metal-nitride based material wherein at least one of the quantum well structures further comprises a capping layer formed on the well layer, the capping layer comprising a second metal-nitride based material having a different metal element compared to the first metal-nitride based material.

Each quantum well structure may further comprise a wetting layer formed between the barrier layer and the well layer for enhancing formation of the quantum dot nanostructures.

The at least one of the quantum well structures may further comprise a second capping layer formed on the capping layer, said second capping layer comprising a third metal-nitride based material having a different metal component compared to the second metal-nitride based material.

The MQW structure may further comprise a p-type contact structure formed on an outermost one of the plurality of quantum well structures, the p-type contact structure may comprise an electron blocking layer and a p-type metal-nitride layer formed on the electron blocking layer.

The p-type metal-nitride layer may comprise an Indium (In) material.

The p-type metal-nitride layer may be formed using a temperature of between about 750° C. to 800° C.

The MQW structure may further comprise an n-type contact layer for making electrical contact to an $n^+$ layer underneath the plurality of quantum well structures.

The MQW structure may be capable of emitting red/yellow light.

The MQW structure may be capable of emitting red light.

The capping layer may comprise aluminium nitride (AlN) material.

A thickness of the capping layer may be maintained at a maximum of about 3 nm.

The quantum dot nanostructures may comprise Indium-Gallium-Nitride (InGaN) quantum dots.

In accordance with a second aspect of the present invention, there is provided a light emitting diode structure, the light emitting diode structure comprising a red/yellow light emitting multiple quantum well (MQW) structure, each quantum well structure of the red/yellow light emitting MQW comprising: a barrier layer; and a well layer having quantum dot nanostructures embedded therein formed on the barrier layer, the barrier and the well layer comprising a first metal-nitride based material; wherein at least one of the quantum well structures of the red/yellow light emitting MQW further comprises a capping layer formed on the well layer, the capping layer comprising a second metal-nitride based material having a different metal element compared to the first metal-nitride based material; and a blue light emitting MQW structure formed integrally with the red/yellow tight emitting MQW for emitting white light from the light emitting diode structure.

The blue light emitting MQW structure may be formed on an outermost one of the plurality of quantum well structures of the red/yellow light emitting MQW structure.

An innermost one of the plurality of quantum well structures of the red/yellow light emitting MQW structure may be formed on the blue light emitting MQW structure.

The light emitting diode structure may further comprise an n-type contact layer for making electrical contact to a $n^+$ layer underneath the red/yellow light emitting and blue light emitting MQW structures and respective p-type contact structures formed on the red/yellow light emitting MQW structure and the blue light emitting MQW structure, the p-type contact structures may each comprise an electron blocking layer and a p-type metal-nitride layer formed on the electron blocking layer.

The light emitting diode structure may further comprise an n-type contact layer for making electrical contact to a $n^+$ layer underneath the blue light emitting MQW structure and a p-type contact structure formed on the blue light emitting MQW structure, for activating the blue light emitting MQW structure; and wherein the red/yellow light emitting MQW structure may be capable of emitting red/yellow light based on absorption of blue light emission from the blue light emitting MQW structure.

The capping layer may comprise aluminium nitride (AlN) material.

A thickness of the capping layer may be maintained at a maximum of about 3 nm.

The quantum dot nanostructures may comprise Indium-Gallium-Nitride (InGaN) quantum dots.

In accordance with a third aspect of the present invention, there is provided a light emitting diode structure, the light emitting diode structure comprising a red/yellow light emitting multiple quantum well (MQW) structure, each quantum well structure of the red/yellow light emitting MQW comprising: a barrier layer; and a well layer having quantum dot nanostructures embedded therein formed on the barrier layer, the barrier and the well layer comprising a first metal-nitride based material; wherein at least one of the quantum well structures of the red/yellow light emitting MQW further comprises a capping layer formed on the well layer, the capping layer comprising a second metal-nitride based material having a different metal element compared to the first metal-nitride based material; a blue light emitting MQW structure; and a green light emitting MQW structure; wherein the blue light emitting MQW structure and the green light emitting MQW structure are formed integrally with the red/yellow light emitting MQW for emitting white light from the light emitting diode structure.

The red/yellow light emitting MQW structure may be formed on the blue light emitting MQW structure and the green light emitting MQW structure.

The light emitting diode structure may further comprise an n-type contact layer for making electrical contact to a $n^+$ layer underneath the red/yellow light emitting, blue light emitting and green light emitting MQW structures; and respective p-type contact structures formed on the blue light emitting MQW structure and the green light emitting MQW structure, for activating the blue light emitting MQW structure and the green light emitting MQW structure respectively; wherein the p-type contact structures may each comprise an electron blocking layer and a p-type metal-nitride layer formed on the electron blocking layer and further wherein the red/yellow light emitting structure may be capable of emitting red/yellow light based on absorption of blue light emission from the blue light emitting MQW structure, green light emission from the green light emitting MQW structure or both.

The capping layer may comprise aluminium nitride (AlN) material.

A thickness of the capping layer may be maintained at a maximum of about 3 nm.

The quantum dot nanostructures may comprise Indium-Gallium-Nitride (InGaN) quantum dots.

In accordance with a fourth aspect of the present invention, there is provided a method of fabricating a multiple quantum well (MQW) structure for a light emitting diode, the method comprising forming a plurality of quantum well structures, each quantum well structure comprising: a barrier layer; and a well layer having quantum dot nanostructures embedded therein formed on the barrier layer, the barrier and the well layer comprising a first metal-nitride based material; and forming at least one of the quantum well structures to further comprise a capping layer on the well layer, the capping layer comprising a second metal-nitride based material having a different metal element compared to the first metal-nitride based material.

In accordance with a fifth aspect of the present invention, there is provided a method of fabricating a light emitting diode structure, the method comprising forming a red/yellow light emitting multiple quantum well (MQW) structure, each quantum well structure of the red/yellow light emitting MQW comprising a barrier layer; and a well layer having quantum dot nanostructures embedded therein formed on the barrier layer, the barrier and the well layer comprising a first metal-nitride based material; forming at least one of the quantum well structures of the red/yellow light emitting MQW to further comprise a capping layer on the well layer, the capping layer comprising a second metal-nitride based material having a different metal element compared to the first metal-nitride based material; and forming a blue light emitting MQW structure integrally with the red/yellow light emitting MQW for emitting white light from the light emitting diode structure.

In accordance with a sixth aspect of the present invention, there is provided a method of fabricating a light emitting diode structure, the method comprising forming a red/yellow light emitting multiple quantum well (MQW) structure, each quantum well structure of the red/yellow light emitting MQW comprising a barrier layer; and a well layer having quantum dot nanostructures embedded therein formed on the barrier layer, the barrier and the well layer comprising a first metal-nitride based material; forming at least one of the quantum well structures of the red/yellow light emitting MQW to further comprise a capping layer on the well layer, the capping layer comprising a second metal-nitride based material having a different metal element compared to the first metal-nitride based material; forming a blue light emitting MQW structure integrally with the red/yellow light emitting MQW; and forming a green light emitting MQW structure integrally with the red/yellow light emitting MQW and the blue light emitting MQW structure for emitting white light from the light emitting diode structure.

BRIEF DESCRIPTION OF THE DRAWINGS

Embodiments of the invention will be better understood and readily apparent to one of ordinary skill in the art from the following written description, by way of example only, and in conjunction with the drawings, in which.

DETAILED DESCRIPTION

In the example embodiments described, growth of LEDs is performed using a metalorganic chemical vapour deposition (MOCVD) system. Trimethylgallium (TMGa), Trimethylindium (TMIn), Trimethylaluminium (TMA), Magnesium ($Cp_2Mg$) and silane ($SiH_4$) are used as the precursors in the example embodiments. Hydrogen and nitrogen are used as the carrier gas for effective incorporation of the elements on the LED surfaces.

In an example embodiment, a multiple quantum well (MQW) structure is grown at a defined temperature with the incorporation of InGaN quantum dots on a InGaN well layer. The formed quantum well is then capped with a thin aluminium nitride (AlN) layer. The example embodiment is described in detail below.

The AlN layer can serve as a cap layer for preventing InGaN quantum dots out-diffusion. The lattice constant of $In_xGa_{1-x}N$ or InN quantum dots is about 3.5446 angstrom (Å) while the lattice constant for the AlN layer is about 3.1114 (Å). This results in a larger lattice mismatch for AlN/InN system (about 13%) as compared to a GaN/InN system (about 10.6%). The larger lattice mismatch can further hamper the out-diffusion of the quantum dots when a high temperature is applied during subsequent layer growth and annealing processes. It is noted by the inventors that the use of the AlN layer as an interlayer after growing a GaN barrier and before growing the InGaN quantum dots and a InGaN well layer is not encouraged because the AlN layer may generate a larger compressive stress on the subsequent InGaN well growth. This may lower the Indium incorporation and blueshift of its emission wavelength.

Figure 1:
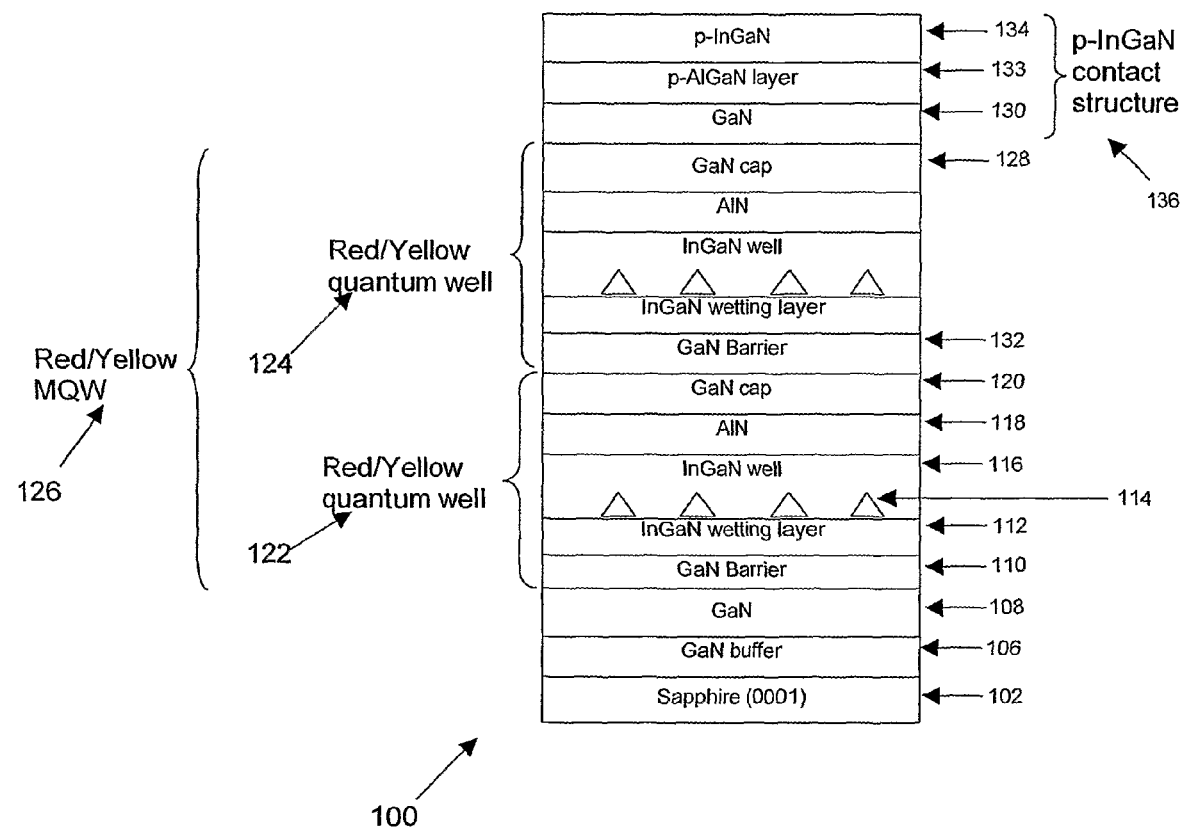
FIG. 1 is a schematic diagram illustrating a monochromatic LED structure.

FIG. 1 is a schematic diagram illustrating a monochromatic LED structure 100 of the example embodiment. A sapphire substrate 102 is provided in a processing chamber. A low temperature buffer layer 106 is grown on the substrate 102 in a temperature range of about 520° C. to 550° C. to a thickness of about 25 nm for facilitating nucleation of GaN on the sapphire substrate 102. A $n^+$ layer 108 of GaN with a doping concentration of $10^{18}$ cm$^{-3}$ is grown on the layer 106 at a temperature of about 900° C. to 1050° C. After growing the layer 108, a GaN barrier layer 110 is grown to a thickness of about 5-15 nm with a Si doping concentration of about $2 \times 10^{17}$ cm$^{-3}$ to $1 \times 10^{18}$ cm$^{-3}$. It will be appreciated by a person skilled in the art that although the barrier layer 110 can be grown without Si doping, Si doping may be preferred because the quality of the barrier layer 110 typically improves with Si doping.

After growing the barrier layer 110, the temperature is lowered to about 700-750° C. and a thin wetting layer 112 of $In_xGa_{1-x}N$ with a composition of x ~0.10-0.20 and of a thickness of about 1 nm is grown over the barrier layer 110. The wetting layer 112 can enhance the incorporation of Indium Nitride rich quantum dots during an In burst process. After forming the thin wetting layer 112, an indium-precursor TMIn is flowed over the substrate 102 at a flow rate of less than about 20 µmol/min between about 6 to 30 seconds to form nanostructures or "quantum dots" e.g. 114 of $In_wGa_{1-w}N$ where 0.2<w<1.0. The In atoms from the Indium precursor, TMIn, can segregate at nitrogen dangling bonds of the wetting layer 112 of InGaN to serve as a seed layer for the growth of InGaN quantum dots e.g. 114, as determined by the precursor flow rate. The amount of TMIn flow acting as antisurfactants and the duration of the TMIn flow are monitored for controlling sizes of the Indium rich InGaN quantum dots e.g. 114. The flow rate of the TMIn is maintained at less than about 20 µmol/min, preferably at about 20 sccm (4.5 µmol/min) to about 80 sccm (18.0 µmol/min), to form the In-rich InGaN quantum dots e.g. 114.

After growing the quantum dots e.g. 114, an InGaN quantum well layer 116 is grown over the nanostructures e.g. 114 to form an embedded InGaN quantum dots/well layer 116 with a thickness of about 3 to 5 nm. The growth temperature of the $In_wGa_{1-w}N$ well layer 116 is maintained at about 700° C. to 750° C. to provide an Indium composition of 0.2<w<0.5. The amount of Indium incorporation is dependent on the desired emission colour. To obtain a monochromatic emission, during growth of the MQWs, temperature fluctuation is kept to a minimum e.g. during the growth of the quantum dots e.g. 114 and the well layer 116. After growing the well layer 116, the well layer 116 is capped with a AlN layer 118. The thickness of the AlN layer 118 is maintained to be relatively thin as compared to the well layer 116 (preferably thinner than about 3 nm). In the example embodiment, a time interval of more than about 30 s is maintained after the growth of the InGaN well layer 116 before growing the AlN layer 118. The temperature for growing the AlN layer 118 and the GaN barrier layer 110 may be set to about 0 to 30° C. higher than the temperature for growing the InGaN well layer 116 for better crystal quality. After growing the AlN layer 118, a GaN cap layer 120 is grown using conditions substantially the same as the conditions for growing the GaN layer 108.

The barrier layer 110 to the GaN cap layer 120 form a red/yellow light emitting quantum well structure 122. In the example embodiment, the steps for forming the barrier layer 110 to the GaN cap layer 120 are repeated (see e.g. quantum well structure 124) to form a red/yellow light emitting multiple quantum well (MQW) structure 126.

It will be appreciated by a person skilled in the art that although only two quantum well structures 122, 124 are illustrated in FIG. 1 for clarity, the number of quantum well structures can range between e.g. three to five. As will be appreciated by a person skilled in the art, forming more quantum well structures e.g. 122, 124 can improve light intensity and broaden the wavelength region of the LED structure 100.

In the example embodiment, the AlN layer 118, having a different lattice constant from InGaN, can provide encapsulation to prevent diffusion of the In rich InGaN quantum dots e.g. 114 into the well layer 116 or into a GaN barrier layer 132 of the next quantum well structure 124, e.g. when subsequent layers, such as the GaN barrier layer 132, are grown at higher temperatures.

For growing the GaN cap layer 128 of the quantum well structure 124, the flow rate of the TMGa is set such that it is the same as the flow rate used for growing a subsequent p-AlGaN layer so that, practically, there is continuity in the flow of TMGa. After growing the GaN cap layer 128, a GaN layer 130 is grown to a thickness of about 15 to 30 nm at a temperature of about 740° C. to 780° C. with a Si doping concentration of about $2 \times 10^{17}$ to $1 \times 10^{18}$ cm$^{-3}$. An electron blocking layer 133 comprising p-Al$_y$Ga$_{1-y}$N (where 0.1<y<0.3) is grown to a thickness of about 20 to 50 nm. A TMA flow for the growth of the p-Al$_y$Ga$_{1-y}$N is maintained at about 40 to 100 μmol/min with a growth temperature of about 750° C. to 800° C. The Cp$_2$Mg source is maintained at about 0.15 to 0.5 μmol/min during the growth. The p-AlGaN layer 133 can serve to block electrons from traversing into a p-InGaN region 134, hence enabling effective recombination at the MQW structure 126.

As will be appreciated by a person skilled in the art, p-GaN is typically grown at a temperature lower than 900° C., in a range of about 760° C. to 825° C., to prevent out-diffusion of quantum dots. However, this gives rise to a low p-type conductivity and poor crystal quality. In the example embodiment, the p-GaN is incorporated with Indium to form p-InGaN to improve conductivity. After growing the p-AlGaN layer 133, the p-type InGaN layer 134 is grown to a thickness of about 150-500 nm. Magnesium is used as the p-dopant and growth is carried out at a temperature range of about 760-800° C., in contrast to the higher temperatures used for growing conventional p-GaN layers. The growth conditions take into consideration a likelihood of degradation of the In-rich InGaN nanostructures. The TMIn flow rate is set in the range of about 80-150 sccm and the chamber pressure is kept at or below about 200 Torr. In Mg-doped GaN grown by MOCVD in a hydrogen ambient, Mg acceptors are passivated by H acceptors yielding electrically inert Mg—H complexes. In the example embodiment, it will be appreciated by a person skilled in the art that, apart from forming the p-InGaN layer 134 at a lower temperature than 900° C., the AlN layer 118 can assist in further preventing out-diffusion of the InGaN quantum dots e.g. 114.

In one implementation, in-situ annealing is carried out for a period of about 10 to 20 mins in a nitrogen ambient to activate the Mg in the p-type In$_m$Ga$_{1-m}$N with m in the range of about 0.05 to 0.10. The annealing temperature is kept at about 20° C. to 50° C. above the growth temperature for the p-type In$_m$Ga$_{1-m}$N layer 134.

In this example embodiment, the GaN layer 130 to the p-InGaN layer 134 form a p-InGaN contact structure 136.

Figure 2:
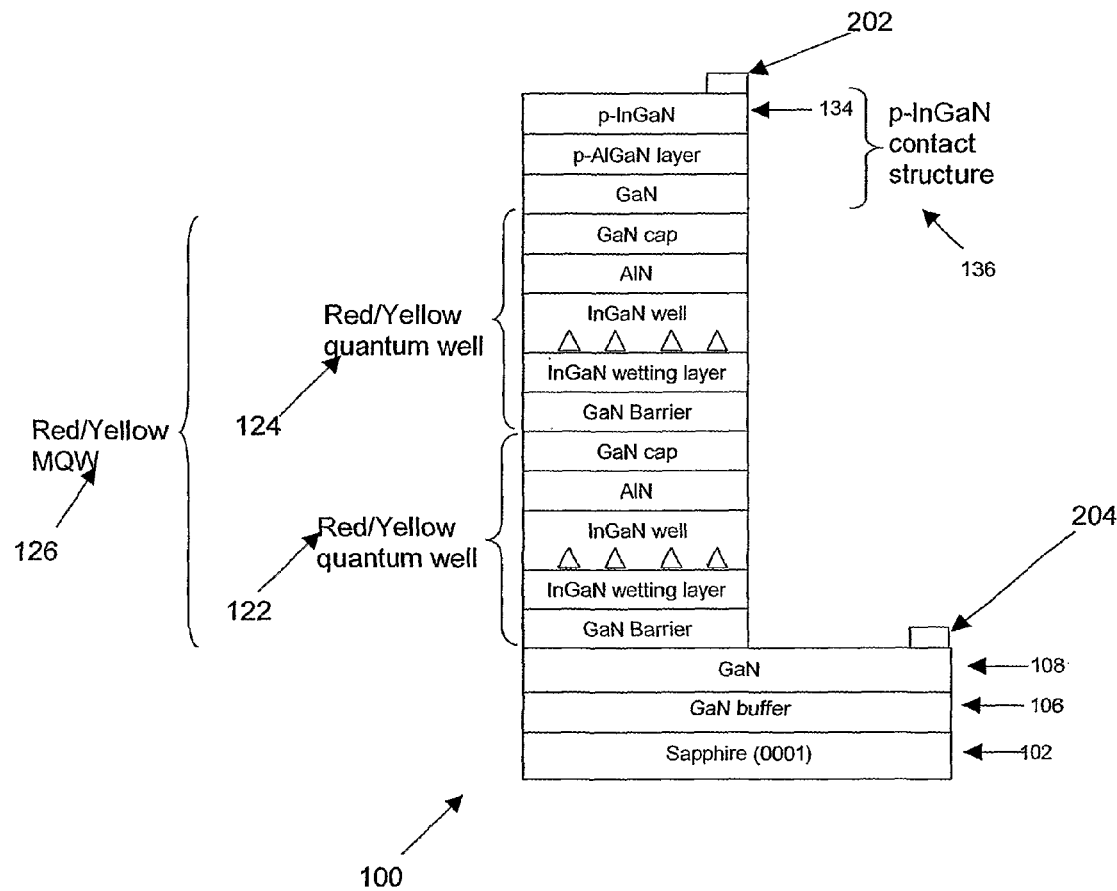
FIG. 2 is a schematic diagram illustrating forming electrical contacts on the monochromatic LED structure.

FIG. 2 is a schematic diagram illustrating forming electrical contacts on the monochromatic LED structure 100 of the example embodiment. The layers on top of GaN layer 108 are etched using Inductive Coupled Plasma Etching (ICP). A p-contact 202 is formed on the p-InGaN layer 134 and a n-contact 204 is formed on the GaN layer 108. Using the p-contact 202 and the n-contact 204, a p-n junction is formed for providing an injection current for activating the LED structure 100 to emit a monochromatic light.

In the above described example embodiment, the respective InGaN wetting layers e.g. 112 of the quantum well structures 122, 124 may enhance formation of Indium-rich quantum dots e.g. 114 and the respective AlN layers e.g. 118 of the quantum well structures 122, 124 may act as caps to prevent the InGaN quantum dots e.g. 114 from diffusion. Furthermore, the respective InGaN wetting layers e.g. 112 may provide better size control for forming the In-rich quantum dots to provide monochromatic light. The above example embodiment may provide a monochromatic LED that can operate in the longer wavelength range e.g. for yellow, orange and/or red light emission.

Figure 3A:
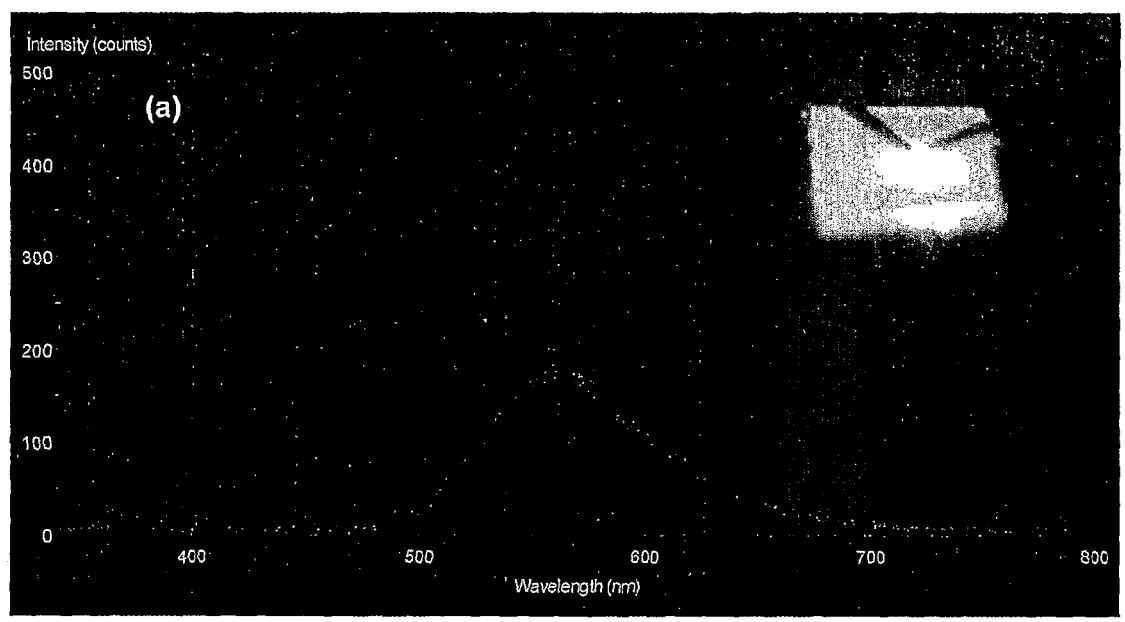
FIGS. 3(a) to (c) are intensity vs wavelength graphs showing electroluminescence spectrums for yellow, orange and red LEDs respectively.
Figure 3B:
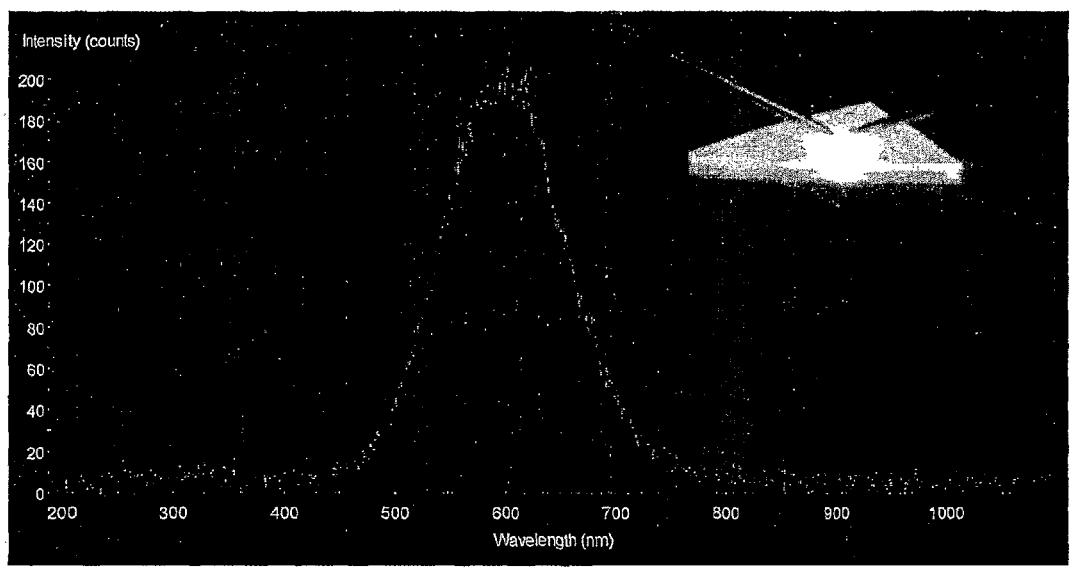
Figure 3C:
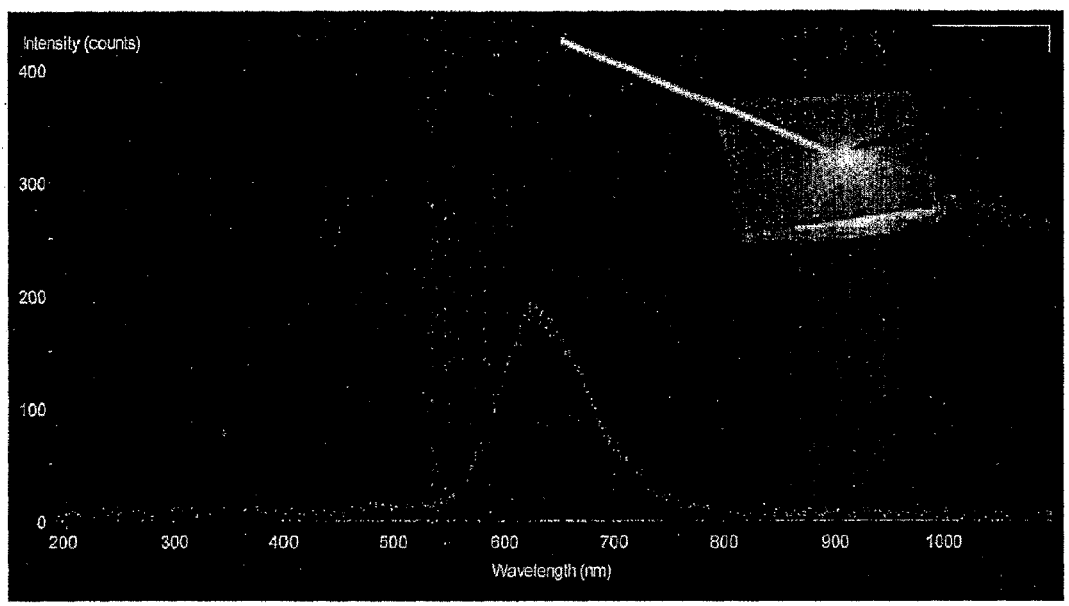

FIGS. 3(a) to (c) are intensity vs wavelength graphs showing electroluminescence spectrums for yellow, orange and red LEDs respectively, each obtained using the above described example embodiment. The TMIn flow during the growth of the In-rich InGaN quantum dots e.g. 114 (FIG. 1) and the growth temperature of the InGaN quantum well layer 116 (FIG. 1) are varied to alter the colour of the light emission. The graphs are based on measurements obtained using an injection current of about 20 mA. From FIGS. 3(a) to (c), it is observed that the intensity of the respective yellow, orange and red LEDs are relatively the same. It is also observed that the central frequencies of the respective yellow, orange and red LEDs are displaced from one another by about 20 nm.

Figure 4:
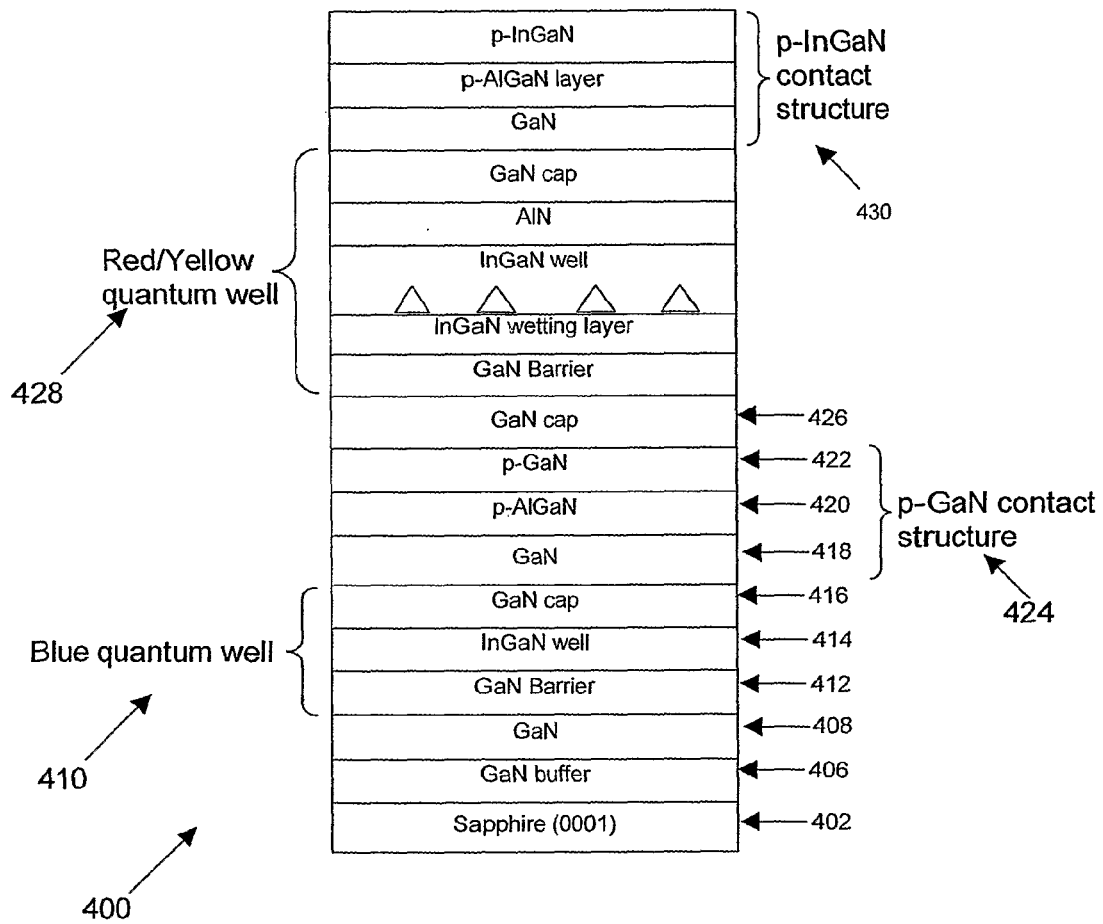
FIG. 4 is a schematic diagram illustrating a tunable white LED structure.

FIG. 4 is a schematic diagram illustrating a tunable white LED structure 400 of another example embodiment. A sapphire substrate 402 is provided in a processing chamber. A low temperature buffer layer 406 is grown on the substrate 402 in a temperature range of about 520° C. to 550° C. to a thickness of about 25 nm for facilitating nucleation of GaN on the sapphire substrate 402. A layer 408 of GaN with a doping concentration of $10^{18}$ cm$^{-3}$ is grown on the layer 406 at a temperature of about 900° C. to 1050° C. After growing the layer 408, a blue light emitting quantum well structure 410 is formed.

For forming the blue light emitting quantum well structure 410, a GaN barrier layer 412 is grown to a thickness of about 5.0-15.0 nm with a Si doping concentration of about $2 \times 10^{17}$ cm$^{-3}$ to $1 \times 10^{18}$ cm$^{-3}$ at about 760° C. to 850° C. After growing the GaN barrier layer 412, an In$_w$Ga$_{1-w}$N well layer 414 with a thickness of about 2.0 to 4.0 nm is grown on the barrier layer 412 at a temperature of about 760° C. to 790° C. to provide an Indium composition of 0.1<w<0.16. After growing the InGaN well layer 414, a GaN cap layer 416 is grown on the InGaN well layer 414. For clarity, only one quantum well structure 410 is illustrated in FIG. 4. It will be appreciated by a person skilled in the art that the steps for growing the quantum well structure 410 can be repeated e.g. for three to five times to form a MQW structure.

After forming the blue light emitting quantum well structure 410, a GaN layer 418 is grown to a thickness of about 15 to 30 nm at a temperature of about 740° C. to 780° C. with a Si doping concentration of about $2 \times 10^{17}$ to $1 \times 10^{18}$ cm$^{-3}$. An electron blocking layer 420 comprising p-$Al_yGa_{1-y}N$ (where 0.1<y<0.3) is grown to a thickness of about 20 to 50 nm at about 800° C. to 1020° C. A TMA flow for the growth of the p-$Al_yGa_{1-y}N$ is maintained at about 40 to 100 µmol/min with a growth temperature of about 750° C. to 800° C. The $Cp_2Mg$ source is maintained at about 0.15 to 0.5 µmol/min during the growth. After growing the p-AlGaN layer 420, a p-GaN layer 422 is grown using Mg as the p-dopant at about 900° C. to 1000° C. In the example embodiment, the layers 418, 420 and 422 form a p-GaN contact structure 424. After forming the p-GaN contact structure 424, a GaN cap layer 426 is grown on the p-GaN contact structure 424 at a temperature range of about 800° C. to about 1020° C. for a thickness of about 10 to 50 nm. The GaN cap layer 426 is grown to "smoothen" the surface of the p-GaN layer 422.

After growing the GaN cap layer 426, a red/yellow light emitting quantum well structure 428 is grown. The processing steps for growing the red/yellow light emitting quantum well structure 428 are substantially the same as the processing steps described for growing the red/yellow light emitting quantum well structure 122 with reference to FIG. 1. In this example embodiment, the TMIn flow during the In-rich InGaN quantum dots growth and the growth temperature of the InGaN well layer may be varied by about 10° C. to 30° C. to enable the quantum well structure 428 to emit red-based colours of different wavelengths such as yellow or orange light.

In this example embodiment, for clarity, only one quantum well structure is illustrated in FIG. 4. It will be appreciated by a person skilled in the art that the processing steps for growing the quantum well structure 428 can be repeated e.g. for three to five times to form a MQW structure (compare MQW structure 126 of FIG. 1).

After growing the quantum well structure 428, a p-InGaN contact structure 430 is formed. The processing steps for forming the p-InGaN contact structure 430 are substantially the same as the processing steps described for forming the p-InGaN contact structure 136 with reference to FIG. 1.

Figure 5:
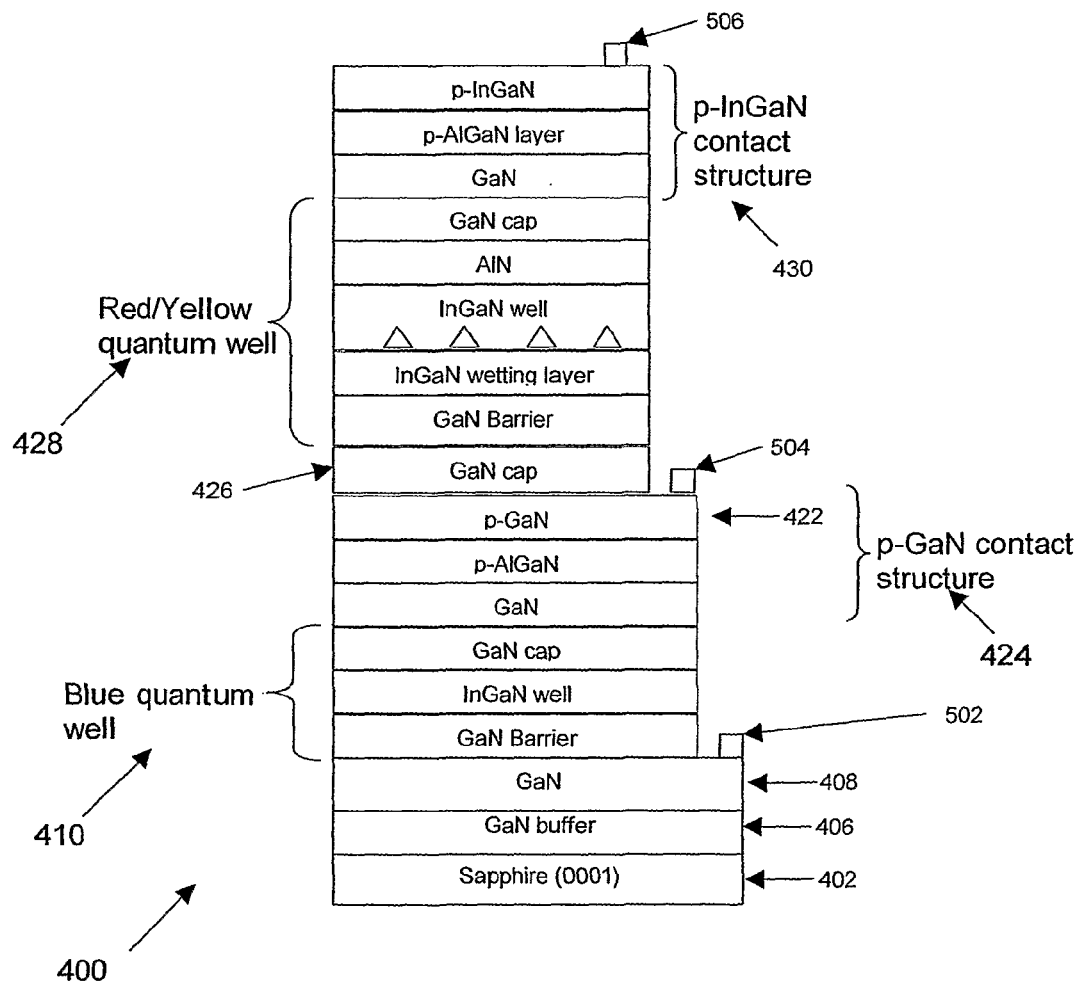
FIG. 5 is a schematic diagram illustrating forming electrical contacts on the tunable white LED structure.

FIG. 5 is a schematic diagram illustrating forming electrical contacts on the tunable white LED structure 400 of the above example embodiment. The layers on top of n-GaN layer 408 are etched using Inductive Coupled Plasma Etching (ICP). The layers on top of p-GaN layer 422 are then etched using ICP. A n-contact 502 is formed on the n-GaN layer 408, a p-contact 504 is formed on the p-GaN layer 422 and a p-contact 506 is formed on the p-InGaN layer of the p-InGaN contact structure 430. The blue light emitting quantum well structure 410 is activated using a p-n junction between the contacts 502 and 504 while the yellow/red light emitting quantum well structure 428 is activated using a p-n junction between the contacts 502 and 506.

In the above described example embodiment, a fraction of the blue light from the blue light emitting quantum well structure 410 travelling through to the top layer may be absorbed by the yellow/red light emitting quantum well structure 428 and re-emitted as yellow light. That is, the yellow light component from the yellow/red tight emitting quantum well structure 428 arises from both direct carrier recombination (due to the p-n junction between the contacts 502 and 506) and absorption of some of the blue light component. Furthermore, since the yellow/red light emitting quantum well structure 428 and the blue light emitting quantum well structure 410 can be provided with varying injection currents separately, the LED structure 400 can provide a tunable white light.

In another example embodiment, the order of growing a red/yellow light emitting quantum well structure and a blue light emitting quantum well structure can be reversed. Thus, in this example embodiment, the red/yellow light emitting quantum well structure is grown first on a sapphire substrate followed by a p-InGaN contact structure, the blue light emitting quantum well structure and a p-GaN contact structure. A p-n junction can be formed using the p-InGaN contact structure to activate the red/yellow light emitting quantum well structure and another p-n junction can be formed using the p-GaN contact structure to activate the blue light emitting quantum well structure.

In the above described example embodiment, since the yellow/red light emitting quantum well structure is grown before the blue light emitting quantum well structure, the yellow light emitted from the yellow/red light emitting quantum well structure is based only on the p-n junction formed using the p-InGaN contact structure (ie. without absorption of blue light). Furthermore, since the yellow/red light emitting quantum well structure and the blue light emitting quantum well structure can be provided with varying injection currents separately, the LED structure can provide a tunable white light.

Figure 6:
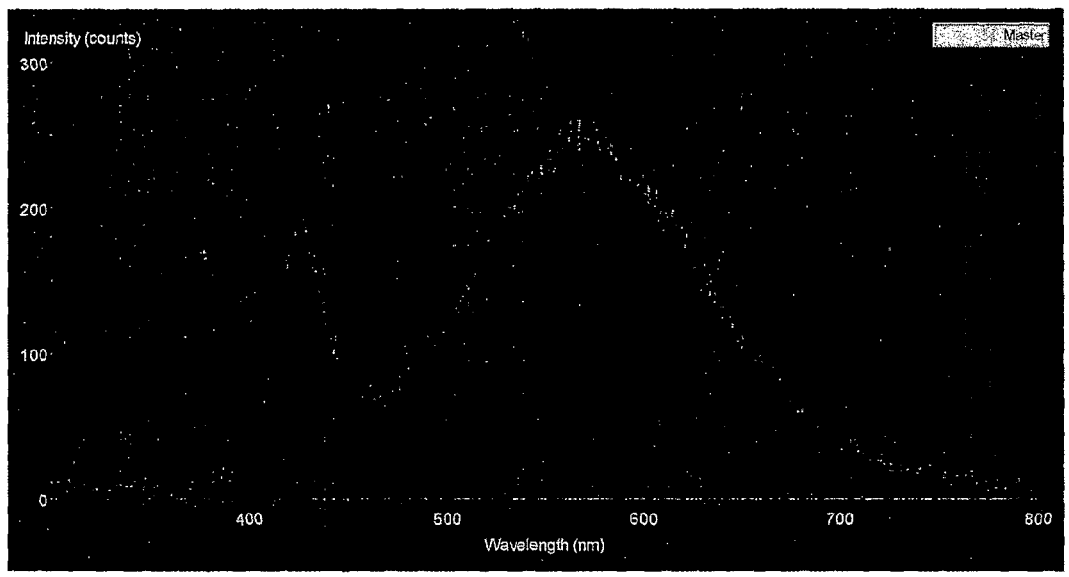
FIG. 6 is an intensity vs wavelength graph showing an electroluminescence spectrum of a "cold" white LED.

FIG. 6 is an intensity vs wavelength graph showing an electroluminescence spectrum of a "cold" tunable white LED. This tunable white LED is formed using processing conditions that are substantially the same as the tunable white LED structure 400 (FIG. 4) but having a yellow emitting quantum well structure grown first followed by a blue emitting quantum well structure.

Figure 7:
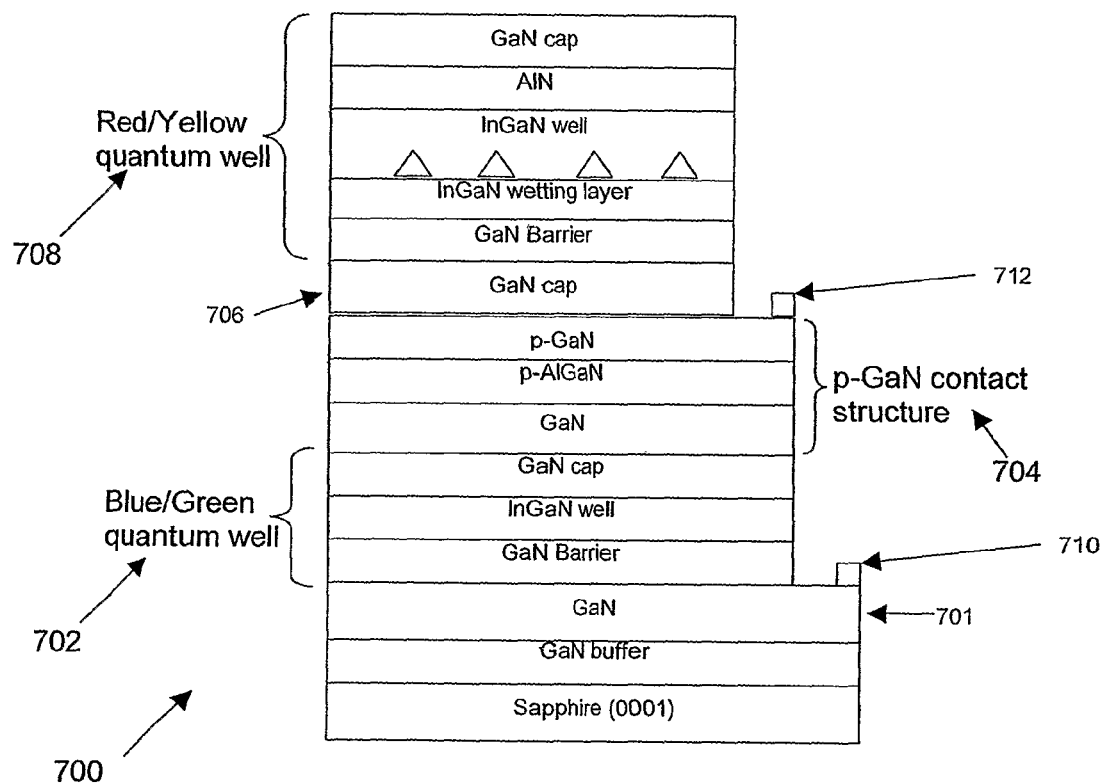
FIG. 7 is a schematic diagram illustrating forming electrical contacts on another tunable white LED structure.

FIG. 7 is a schematic diagram illustrating a tunable white LED structure 700 of yet another example embodiment. The LED structure 700 comprises a GaN layer 701, a blue/green light emitting quantum well structure 702 grown on the GaN layer 701, a p-GaN contact structure 704 grown on the quantum well structure 702, a GaN cap layer 706 grown on the p-GaN contact structure 704 and a red/yellow light emitting quantum well structure 708 grown on the GaN cap layer 706. The processing steps for forming the LED structure 700 are substantially the same as the processing steps for forming the LED structure 400 with reference to FIG. 4 but with the exception that a p-InGaN contact structure is not formed on the red/yellow light emitting quantum well structure 708.

In this example embodiment, for clarity, one quantum well structure each for blue/green light emitting quantum well structure 702 and the red/yellow light emitting quantum well structure 708 is illustrated in FIG. 7. It will be appreciated by a person skilled in the art that the processing steps for growing the quantum well structures 702 and 708 can be repeated, e.g. for three to five times, during formation of the respective quantum well structures 702 and 708 to form a MQW structure each for emitting blue/green light and red/yellow light respectively (e.g. compare MQW structure 126 of FIG. 1).

In the example embodiment, the layers on top of the GaN layer 701 are etched using Inductive Coupled Plasma Etching (ICP). The layers on top of the p-GaN contact structure 704 are then etched using ICP. A n-contact 710 is formed on the GaN layer 701 and a p-contact 712 is formed on the p-GaN contact structure 704. The blue/green light emitting quantum well structure 702 is activated using a p-n junction between the contacts 710 and 712 while the red/yellow light emitting quantum well structure 708 is activated based on absorption of the blue light emitted from the blue/green light emitting quantum well structure 702. Thus, in this example embodiment, there is no separate p-n junction for activating the red/yellow light emitting quantum well structure 708.

In the above described example embodiment, since the blue/green light emitting quantum well structure 702 can be provided with varying injection currents, the LED structure 700 can provide a tunable white light. It will be appreciated by a person skilled in the art that the red/yellow light emitting quantum well structure 708 may be indirectly "tunable" based on the amount of blue light available for absorption.

In the above described example embodiment, white light is formed by a mixing of the electroluminescence blue/green light with the photoluminescence yellow/red light. One advantage provided by this example embodiment is that high temperature growth and annealing of the p-GaN contact structure 704, which typically cause InN or In-rich nanostructures/quantum dots out-diffusion, is no longer a concern since the p-GaN contact structure 704 is grown before growing the red/yellow light emitting quantum well structure 708. This example embodiment can provide a GaN/InGaN crystal based structure and may provide better color rendering compared to current technologies. In this example embodiment, the GaN cap layer 706 can also prevent Mg out-diffusion from the p-GaN contact structure 704.

Figure 8:
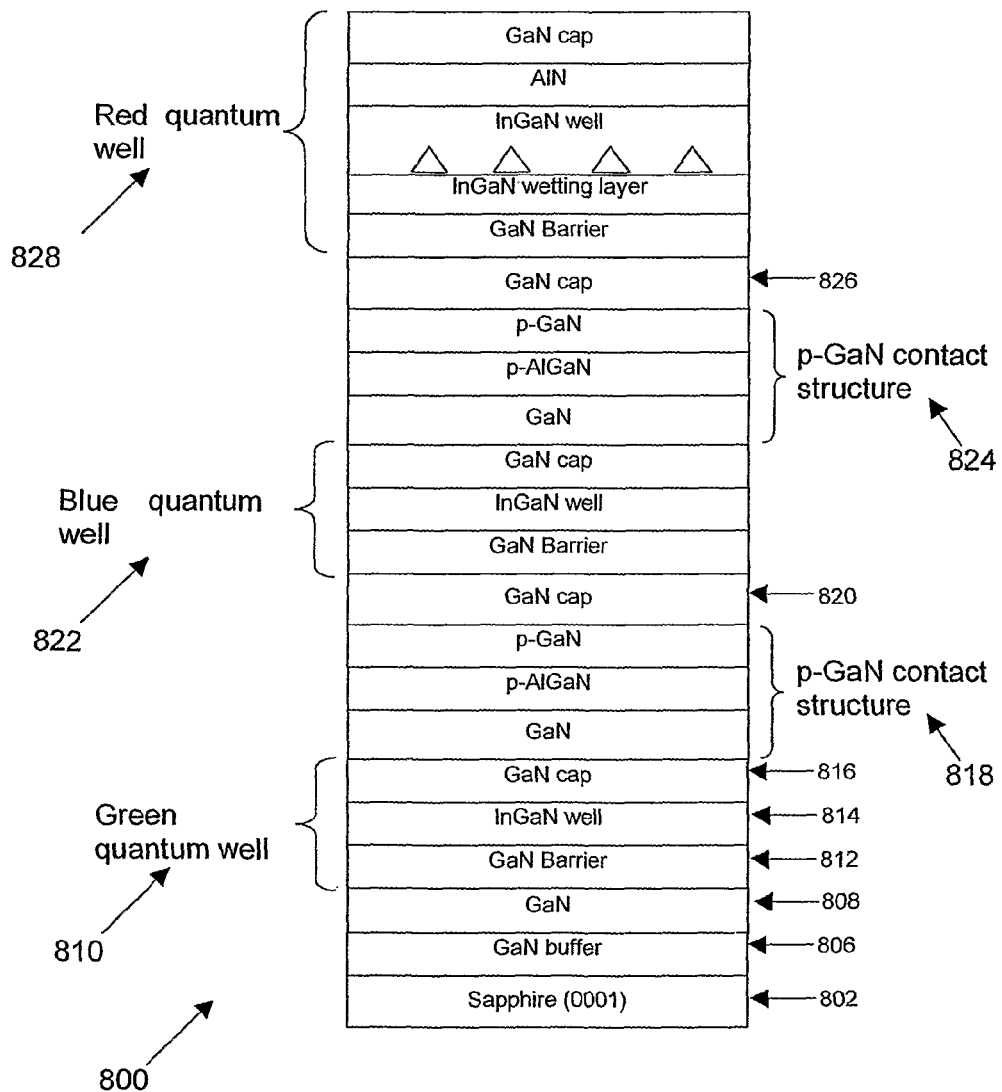
FIG. 8 is a schematic diagram illustrating a yet another tunable white LED structure.

FIG. 8 is a schematic diagram illustrating a tunable white LED structure 800 in yet another example embodiment. A sapphire substrate 802 is provided in a processing chamber. A low temperature buffer layer 806 is grown on the substrate 802 in a temperature range of about 520° C. to 550° C. to a thickness of about 25 nm for facilitating nucleation of GaN on the sapphire substrate 802. A layer 808 of GaN with a doping concentration of $10^{18}$ cm$^{-3}$ is grown on the layer 806 at a temperature of about 900° C. to 1050° C. After growing the layer 808, a green light emitting quantum well structure 810 is formed.

For forming the green light emitting quantum well structure 810, a GaN barrier layer 812 is grown to a thickness of about 5.0-15.0 nm with a Si doping concentration of about $2\times10^{17}$ cm$^{-3}$ to $1\times10^{18}$ cm$^{-3}$ at about 750° C. to 850° C. After growing the GaN barrier layer 812, an In$_w$Ga$_{1-w}$N well layer 814 having a thickness of about 2.0 to 4.0 nm is grown on the barrier layer 812 at a temperature of about 730° C. to 770° C. to provide an Indium composition of $0.19<w<0.26$. After growing the InGaN well layer 814, a GaN cap layer 816 is grown on the InGaN well layer 814.

In this example embodiment, for clarity, only one green light emitting quantum well structure is illustrated in FIG. 8. It will be appreciated by a person skilled in the art that the processing steps for growing the quantum well structure 810 can be repeated e.g. for three to five times to form a MQW structure.

After forming the green light emitting quantum well structure 810, a p-GaN contact structure 818 is grown on the green light emitting quantum well structure 810. The processing steps for growing the p-GaN contact structure 818 are substantially the same as the processing steps for growing the p-GaN contact structure 424 with reference to FIG. 4. After forming the p-GaN contact structure 818, a GaN cap layer 820 is grown over the p-GaN contact structure 818. After growing the GaN cap layer 820, a blue light emitting quantum well structure 822 is formed on the GaN cap layer 820.

The processing steps for forming the blue light emitting quantum well structure 822 are substantially the same as the processing steps for forming the blue light emitting quantum well structure 410 with reference to FIG. 4. In this example embodiment, for clarity, only one blue light emitting quantum well structure is illustrated in FIG. 8. It will be appreciated by a person skilled in the art that the processing steps for growing the quantum well structure 822 can be repeated e.g. for three to five times to form a MQW structure.

Alternatively, it will be appreciated that the blue light emitting quantum well structure 822 can be grown first followed by the green light emitting quantum well structure 810.

In this example embodiment, after forming the blue light emitting quantum well structure 822, another p-GaN contact structure 824 is grown on the blue light emitting quantum well structure 822. The processing steps for growing the p-GaN contact structure 824 are substantially the same as the processing steps for growing the p-GaN contact structure 424 with reference to FIG. 4. After forming the p-GaN contact structure 824, a GaN cap layer 826 is grown over the p-GaN contact structure 824. After growing the GaN cap layer 826, a red light emitting quantum well structure 828 is formed on the GaN cap layer 826.

The processing steps for forming the red light emitting quantum well structure 828 are substantially the same as the processing steps for forming the red light emitting quantum well structure 122 with reference to FIG. 1. In this example embodiment, for clarity, only one red light emitting quantum well structure is illustrated in FIG. 8. It will be appreciated by a person skilled in the art that the processing steps for growing the quantum well structure 828 can be repeated e.g. for three to five times to form a MQW structure (compare MQW structure 126 of FIG. 1).

Figure 9:
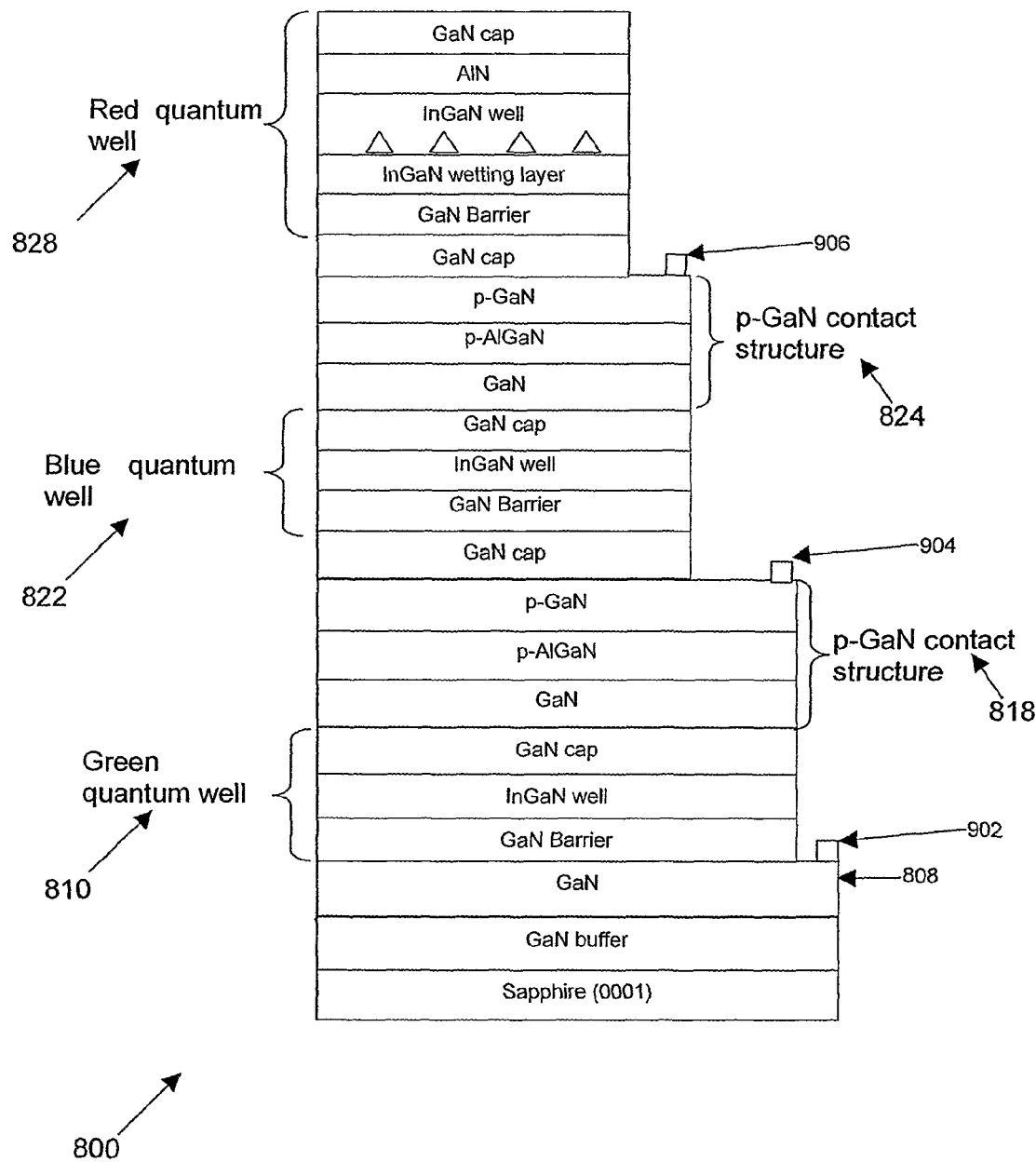
FIG. 9 is a schematic diagram illustrating forming electrical contacts on the tunable LED structure.

FIG. 9 is a schematic diagram illustrating forming electrical contacts on the LED structure 800 of the above example embodiment. The layers on top of GaN layer 808 are etched using Inductive Coupled Plasma Etching (ICP). Following the etching of the layer 808, the layers on top of the p-GaN contact structure 818 and p-GaN contact structure 824 are then etched sequentially using ICP. A n-contact 902 is formed on the GaN layer 808, a p-contact 904 is formed on the p-GaN contact structure 818 and a p-contact 906 is formed on the p-GaN contact structure 824. The green light emitting quantum well structure 810 is activated using a p-n junction between the contacts 902 and 904 while the blue light emitting quantum well structure 822 is activated using a p-n junction between the contacts 902 and 906. The red light emitting quantum well structure 828 is activated based on absorption of the blue/green light emitted from the green and blue light emitting quantum well structures 810, 822 respectively. Thus, in this example embodiment, there is no separate p-n junction for activating the red light emitting quantum well structure 828.

In the above described example embodiment, since the green and blue light emitting quantum well structures 810, 822 can be provided with varying injection currents, the LED structure 800 can provide a tunable white light. It will be appreciated that the red light emitting quantum well structure 828 may be indirectly "tunable" based on the amount of blue/green light available for absorption.

The above described example embodiments can provide monochromatic yellow, orange and/or red LEDs which make use of Indium rich InGaN quantum dots to enhance Indium incorporation so as to achieve emission in the longer wavelength region.

Figure 10:
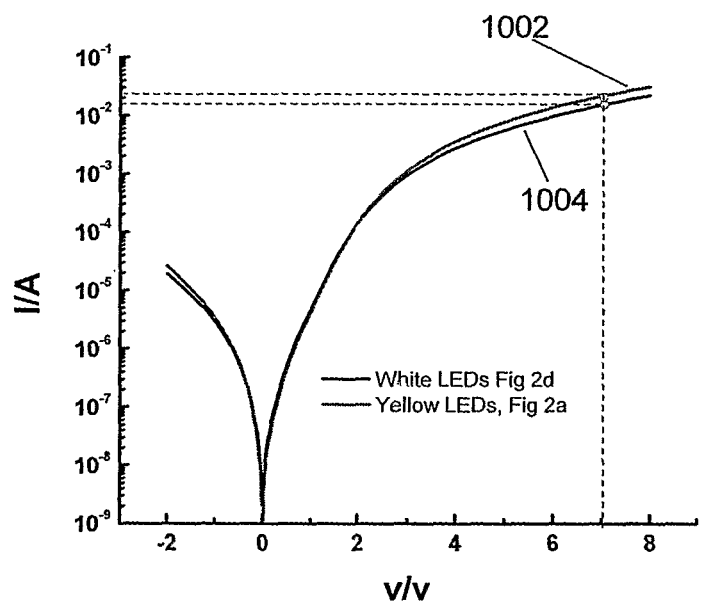
FIG. 10 is a current (I) vs voltage (V) graph showing I-V measurements taken from a yellow LED structure and a white LED structure.

FIG. 10 is a current (I) vs voltage (V) graph showing I-V measurements taken from a yellow LED structure (refer to FIG. 3(a)) and a white LED structure (refer to FIG. 4). Plot 1002 is based on measurements taken from the yellow LED structure and Plot 1004 is based on measurements taken from the white LED structure. It can be observed from plots 1002, 1004 that the respective LED structures exhibit stable conventional diode characteristics.

Figure 11:
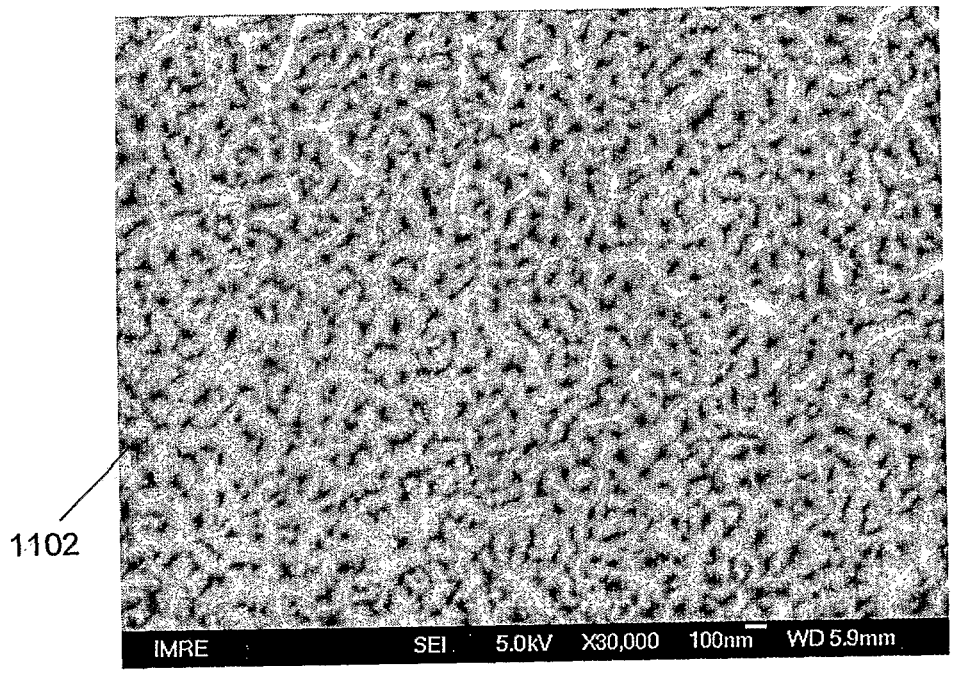
FIG. 11 is a Scanning Electron Microscopy (SEM) image showing surface morphology of a white LED structure.

FIG. 11 is a Scanning Electron Microscopy (SEM) image 1102 showing surface morphology of the white LED structure 400 with reference to FIG. 4. As shown in the image 1102, the p-InGaN layer of the p-InGaN contact structure 430 (FIG. 4) has a porous-like surface and this enhances the light extraction from the quantum well structures e.g. 410, 428 (FIG. 4) by providing scattering effects.

Figure 12:
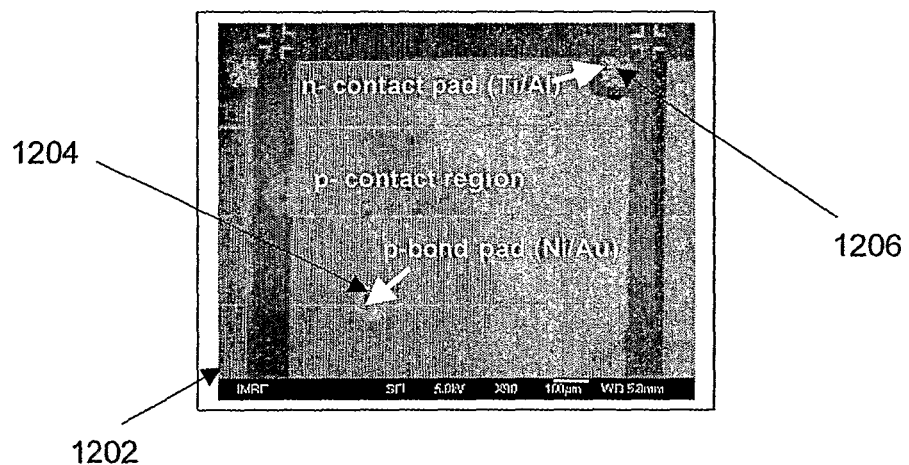
FIG. 12 is a Scanning Electron Microscopy (SEM) image showing surface morphology of a sample white LED structure having a structure as schematically shown in FIG. 7.

FIG. 12 is a Scanning Electron Microscopy (SEM) image 1202 showing surface morphology of a sample white LED structure based on the white LED structure 700 with reference to FIG. 7. The image 1202 shows the p-contact as a Ni/Au contact pad 1204 and the n-contact as a Ti/Al contact pad 1206.

Figure 13:
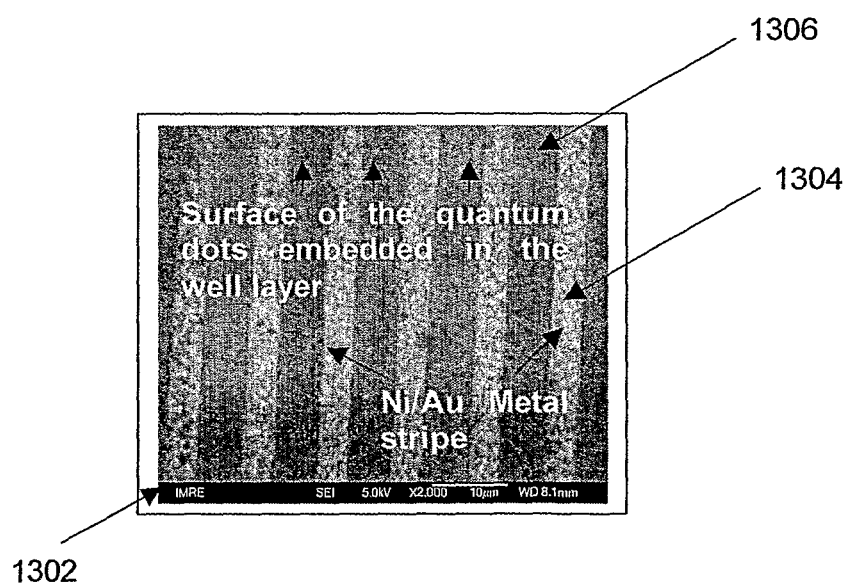
FIG. 13 is a magnified Scanning Electron Microscopy (SEM) image of the SEM image of the white LED structure having a structure as schematically shown in FIG. 7.

FIG. 13 is a magnified Scanning Electron Microscopy (SEM) image 1302 of the image 1202 of FIG. 12. As shown in the image 1302, the p-contact is in the form of Ni/Au metal stripes e.g. 1304 and the surface 1306 of the red/yellow quantum well structure is visible between the stripes e.g. 1304.

Figure 14:
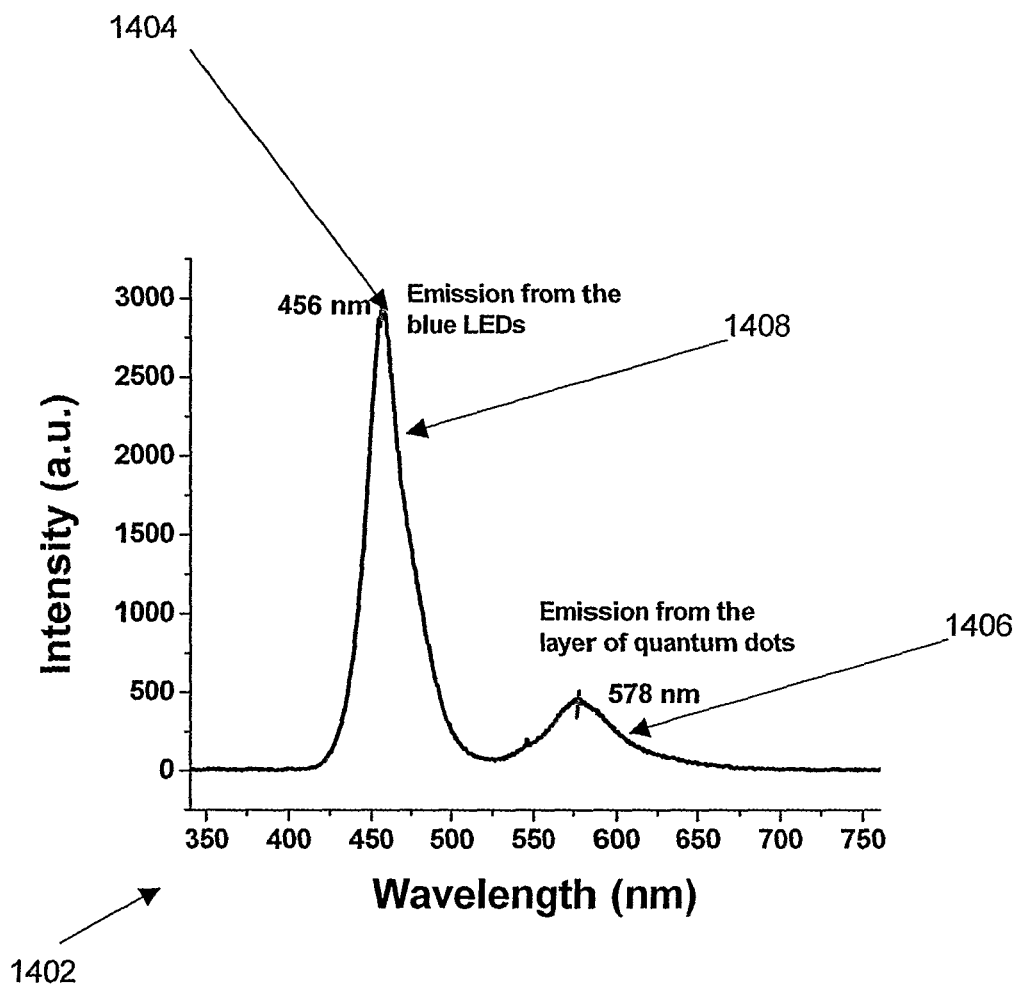
FIG. 14 is an intensity vs wavelength graph showing an electroluminescence spectrum of the white LED structure having a structure as schematically shown in FIG. 7.

FIG. 14 is an intensity vs wavelength graph 1402 showing an electroluminescence spectrum of the sample white LED structure of FIGS. 12 and 13. The graph 1402 shows an emission peak 1404 at about 456 nm. The emission peak 1404 of an emission 1408 is generated by the blue/green light emitting quantum well structure. The graph 1402 also shows a broad-base and low intensity emission 1406. The emission 1406 is generated by the red/yellow light emitting quantum well structure. It will be appreciated by a person skilled in the art that since the red/yellow light emitting quantum well structure is activated based on absorption of the blue light emitted from the blue/green light emitting quantum well structure, the red/yellow light emission 1406 has a lower intensity than the blue light emission 1408.

Figure 15:
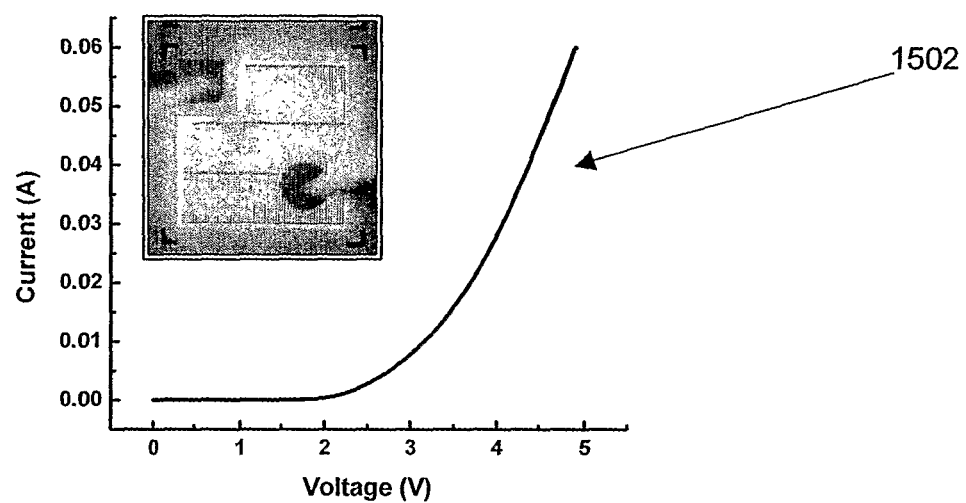
FIG. 15 is a current (I) vs voltage (V) graph showing I-V measurements taken from the white LED structure having a structure as schematically shown in FIG. 7.

FIG. 15 is a current (I) vs voltage (V) graph 1502 showing I-V measurements taken from the sample white LED structure of FIGS. 12 and 13. It can be observed from the graph 1502 that the white LED structure exhibits a good I-V characteristic with a turn-on voltage of about 3V and a current of about 60 mA at about 5V.

Figure 16:
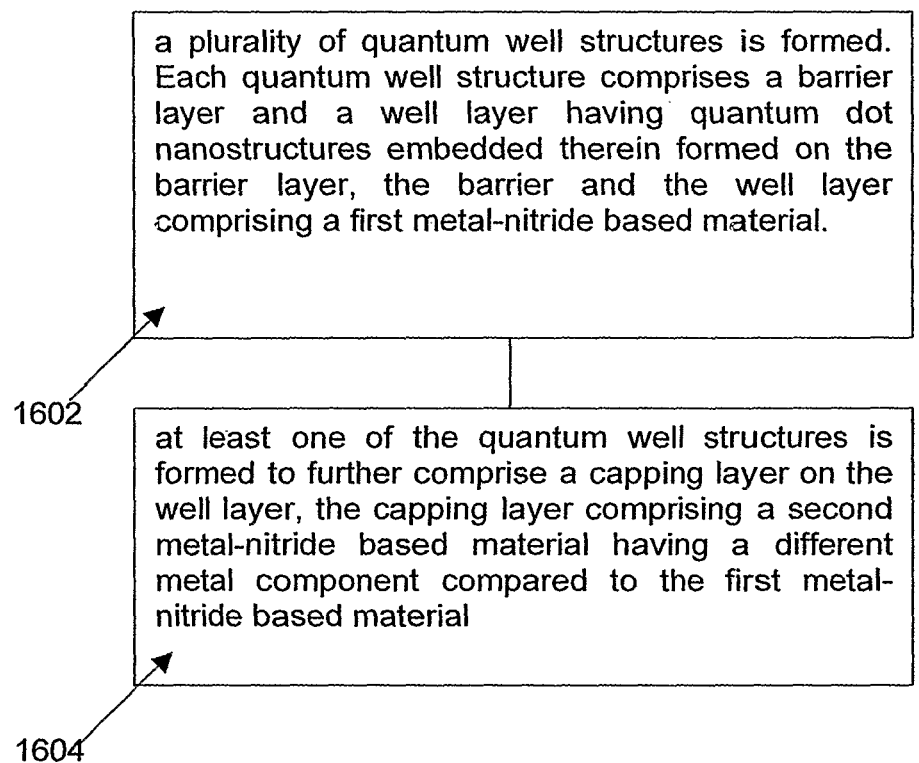
FIG. 16 is a flowchart illustrating a method for fabricating a MQW structure for a light emitting diode.

FIG. 16 is a flowchart illustrating a method for fabricating a MQW structure for a light emitting diode. At step 1602, a plurality of quantum well structures is formed. Each quantum well structure comprises a barrier layer and a well layer having quantum dot nanostructures embedded therein formed on the barrier layer, the barrier and the well layer comprising a first metal-nitride based material. At step 1604, at least one of the quantum well structures is formed to further comprise a capping layer on the well layer, the capping layer comprising a second metal-nitride based material having a different metal component compared to the first metal-nitride based material.

Figure 17:
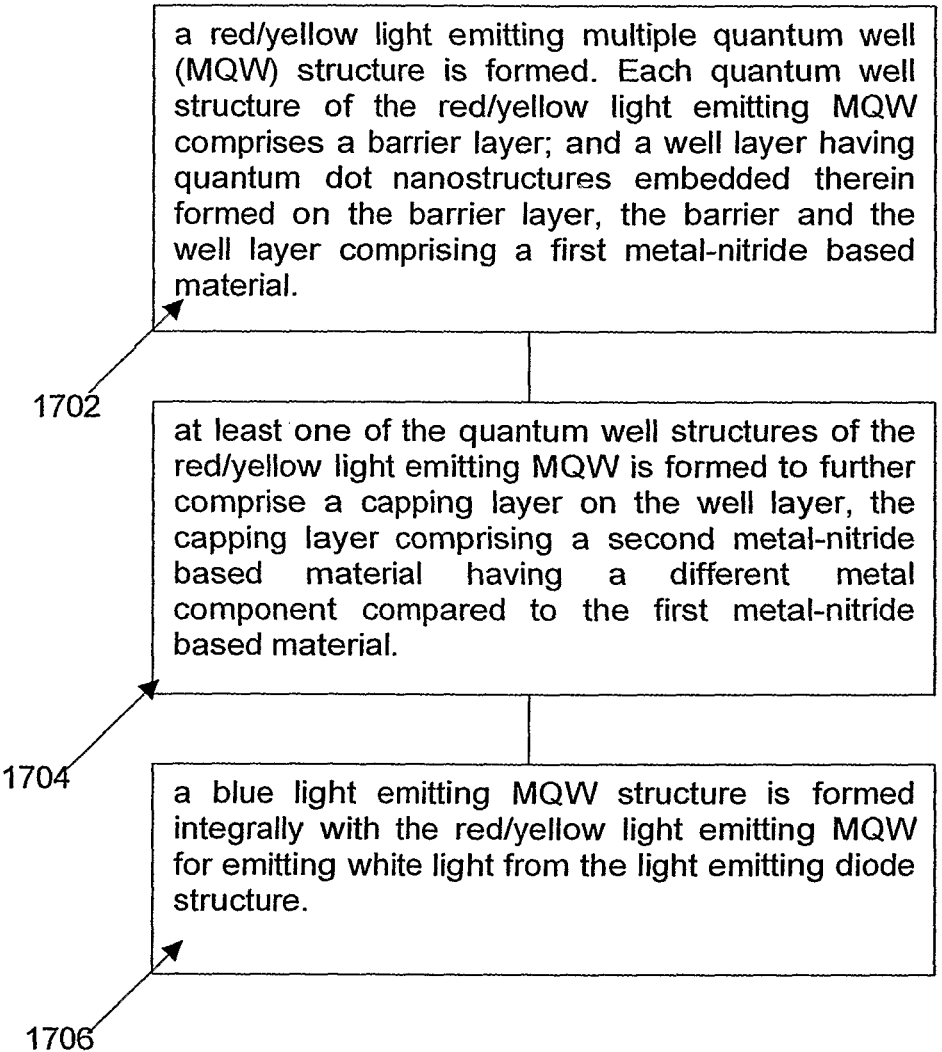
FIG. 17 is a flowchart illustrating a method of fabricating a light emitting diode structure.

FIG. 17 is a flowchart illustrating a method of fabricating a light emitting diode structure. At step 1702, a red/yellow light emitting multiple quantum well (MQW) structure is formed. Each quantum well structure of the red/yellow light emitting MQW comprises a barrier layer; and a well layer having quantum dot nanostructures embedded therein formed on the barrier layer, the barrier and the well layer comprising a first metal-nitride based material. At step 1704, at least one of the quantum well structures of the red/yellow light emitting MQW is formed to further comprise a capping layer on the well layer, the capping layer comprising a second metal-nitride based material having a different metal component compared to the first metal-nitride based material. At step 1706, a blue light emitting MQW structure is formed integrally with the red/yellow light emitting MQW for emitting white light from the light emitting diode structure.

Figure 18:
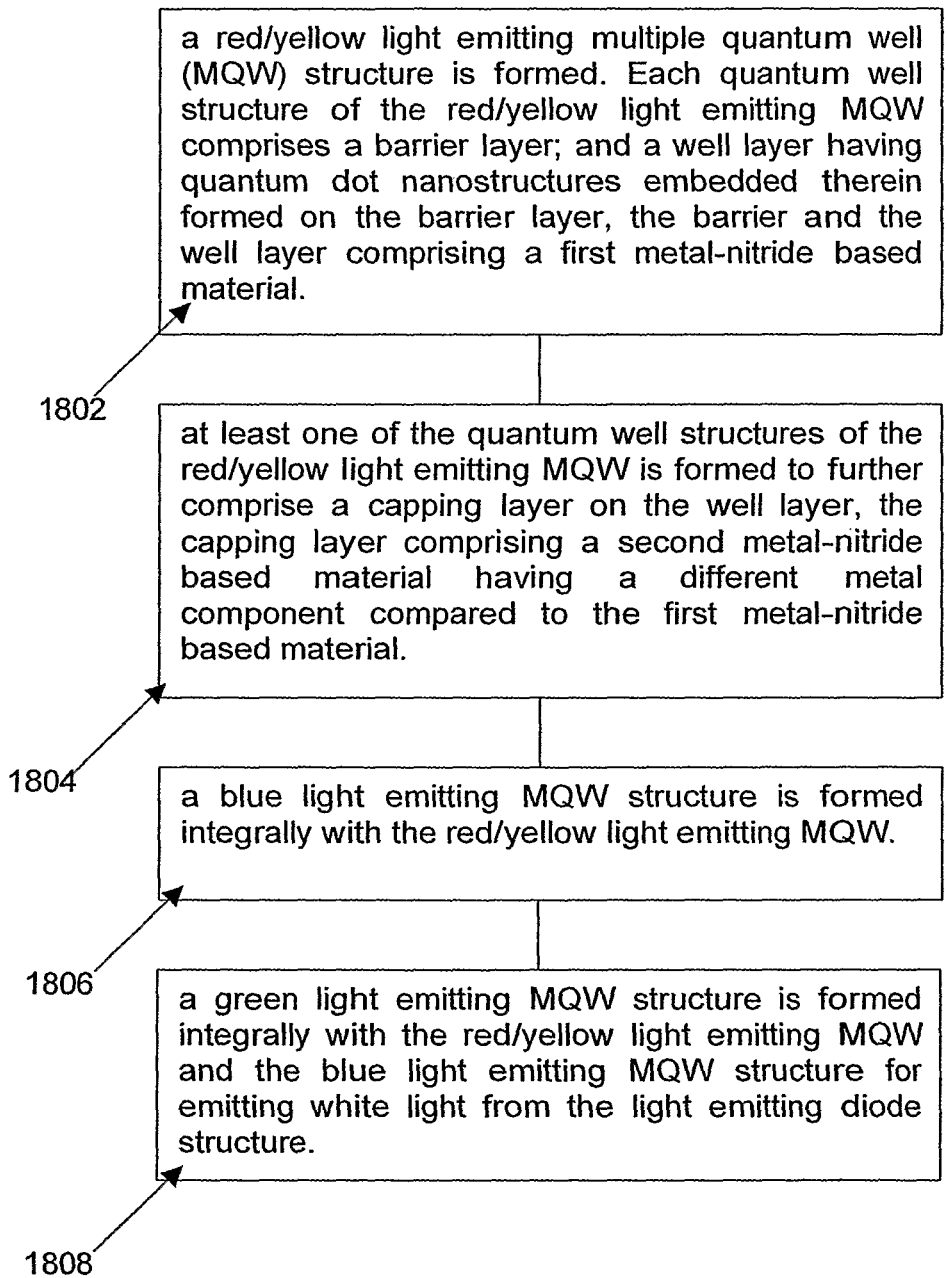
FIG. 18 is a flowchart illustrating another method of fabricating a light emitting diode structure.

FIG. 18 is a flowchart illustrating another method of fabricating a light emitting diode structure. At step 1802, a red/yellow light emitting multiple quantum well (MQW) structure is formed. Each quantum well structure of the red/yellow light emitting MQW comprises a barrier layer; and a well layer having quantum dot nanostructures embedded therein formed on the barrier layer, the barrier and the well layer comprising a first metal-nitride based material. At step 1804, at least one of the quantum well structures of the red/yellow light emitting MQW is formed to further comprise a capping layer on the well layer, the capping layer comprising a second metal-nitride based material having a different metal component compared to the first metal-nitride based material. At step 1806, a blue light emitting MQW structure is formed integrally with the red/yellow light emitting MQW. At step 1808, a green light emitting MQW structure is formed integrally with the red/yellow light emitting MQW and the blue light emitting MQW structure for emitting white light from the light emitting diode structure.

In the above described embodiments, In-rich InGaN quantum dots or nanostructures embedded in well layers are used to generate red, amber and/or yellow light. Each active quantum well layer is encapsulated by a thin AlN layer to prevent out-diffusion to a GaN barrier e.g. during high in-situ annealing. To generate white light, a combination of different colour MQWs may be built in a single LED structure. Hence, there may not be a need to use complex circuitry to operate the devices of the described example embodiments. Further, since phosphor is not used, fabrication techniques may be simplified and the example embodiments can resolve the issues of degradation of phosphor and the different degradation behaviour of different material-based LEDs as in typical RGB LEDs. The described example embodiments can also eliminate the use of an external coating of phosphor on the LED chip. In addition, incorporation of In-rich InGaN quantum dots in the described example embodiments may further enhance recombination efficiency and may offer better stability e.g. during high temperature operations.

Furthermore, with the described example embodiments capable of providing each primary colour of blue, green and red emission from individual quantum well structures, through controlling dot sizes and In composition, it is possible to obtain different qualities of white e.g. "cool" white, "apple" white or "warm" white.

As discussed in the Background section, it is practically difficult to produce GaN LEDs mainly due to a difficulty in obtaining a high Indium incorporation in an InGaN layer. This typically arises due to the solid immiscibility of Indium and its decomposition at high temperatures. In the above described example embodiments, a thin InGaN wetting layer is used to enhance incorporation of the Indium during a TMI burst step. This may enhance formation of Indium rich InGaN quantum dots which has been found to push the emission wavelength into the red wavelength region. To obtain a monochromatic emission colour e.g. in the longer wavelength region, the temperature during growth of the In-rich quantum dots and InGaN well is kept stable. Fluctuations in temperature may lead to slight changes of wavelength when a voltage bias is applied. Further, with regard to temperature, the Indium rich InGaN quantum dots formed typically diffuse into e.g. a well layer and also a barrier layer when a p-GaN layer is grown at a temperature of approximately 900° C. In the described example embodiments, during the growth of the p-InGaN layer, the temperature is reduced to about 750° C. to 800° C. It will be appreciated that in-situ annealing at about 800° C. to 850° C. can still shift the emission wavelength due to diffusion of Indium in the quantum dots. Therefore, in the described example embodiments, the use of the AlN layer can prevent out diffusion of Indium from the quantum dots during growth of the p-InGaN layer, growth of other layers in high temperatures and/or during in-situ annealing at about 800° C. to 850° C. In addition, the described example embodiments can obtain primary colours of emission from GaN LEDs and this can enable better colour rendering of white light for solid state lighting.

Using the above described example embodiments, InGaN red emitting quantum dots LEDs can be used for a number of applications such as for illumination and display purposes including illumination of signboards and displays; keypad light guides, digital camera flash lights, PC monitor backlighting; colour rendering; solid state lighting and for automobile taillights and traffic lights etc.

It will be appreciated by a person skilled in the art that although conventional organic LEDs (OLED) may offer flexible displays with colours of yellow, orange and red, the OLEDs are typically poorer in terms of the lumens and luminescence efficiency than inorganic LEDs such as those of the example embodiments.

It will be appreciated by a person skilled in the art that numerous variations and/or modifications may be made to the present invention as shown in the specific embodiments without departing from the spirit or scope of the invention as broadly described. The present embodiments are, therefore, to be considered in all respects to be illustrative and not restrictive.

The invention claimed is:

1. A light emitting diode structure, the light emitting diode structure comprising
   a red/yellow light emitting multiple quantum well (MQW) structure, each quantum well structure of the red/yellow light emitting MQW comprising:
   a barrier layer; and
   a well layer having quantum dot nanostructures embedded therein formed on the barrier layer, the barrier and the well layer comprising a first metal-nitride based material;
   wherein at least one of the quantum well structures of the red/yellow light emitting MQW further comprises a capping layer formed on the well layer, the capping layer comprising a second metal-nitride based material having a different metal element compared to the first metal-nitride based material; and
   a blue light emitting MQW structure formed integrally with the red/yellow light emitting MQW for emitting white light from the light emitting diode structure.

2. The light emitting diode structure as claimed in claim 1, wherein the blue light emitting MQW structure is formed on an outermost one of the plurality of quantum well structures of the red/yellow light emitting MQW structure.

3. The light emitting diode structure as claimed in claim 1, wherein an innermost one of the plurality of quantum well structures of the red/yellow light emitting MQW structure is formed on the blue light emitting MQW structure.

4. The light emitting diode structure as claimed in claim 1, further comprising an n-type contact layer for making electrical contact to a $n^+$ layer underneath the red/yellow light emitting and blue light emitting MQW structures and respective p-type contact structures formed on the red/yellow light emitting MQW structure and the blue light emitting MQW structure, the p-type contact structures each comprising an electron blocking layer and a p-type metal-nitride layer formed on the electron blocking layer.

5. The light emitting diode structure as claimed in claim 3, further comprising
   an n-type contact layer for making electrical contact to a $n^+$ layer underneath the blue light emitting MQW structure and a p-type contact structure formed on the blue light emitting MQW structure, for activating the blue light emitting MQW structure; and
   wherein the red/yellow light emitting MQW structure is capable of emitting red/yellow light based on absorption of blue light emission from the blue light emitting MQW structure.

6. The light emitting diode structure as claimed in claim 1, wherein the capping layer comprises aluminium nitride (AlN) material.

7. The light emitting diode structure as claimed in claim 1, wherein a thickness of the capping layer is maintained at a maximum of about 3 nm.

8. The light emitting diode structure as claimed in claim 1, wherein the quantum dot nanostructures comprise Indium-Gallium-Nitride (InGaN) quantum dots.

9. A method of fabricating a light emitting diode structure, the method comprising
   forming a red/yellow light emitting multiple quantum well (MQW) structure, each quantum well structure of the red/yellow light emitting MQW comprising:
   a barrier layer; and
   a well layer having quantum dot nanostructures embedded therein formed on the barrier layer, the barrier and the well layer comprising a first metal-nitride based material;
   forming at least one of the quantum well structures of the red/yellow light emitting MQW to further comprise a capping layer on the well layer, the capping layer comprising a second metal-nitride based material having a different metal element compared to the first metal-nitride based material; and
   forming a blue light emitting MQW structure integrally with the red/yellow light emitting MQW for emitting white light from the light emitting diode structure.

* * * * *